(12) United States Patent
Wu et al.

(10) Patent No.: US 11,024,825 B2
(45) Date of Patent: Jun. 1, 2021

(54) ARRAY SUBSTRATE, METHOD FOR MANUFACTURING THE SAME, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Pohsien Wu, Beijing (CN); Hungchieh Hu, Beijing (CN); Yujhun Song, Beijing (CN); Chenyu Chen, Beijing (CN); Yuhsiung Feng, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 51 days.

(21) Appl. No.: 16/516,461

(22) Filed: Jul. 19, 2019

(65) Prior Publication Data
US 2020/0212348 A1   Jul. 2, 2020

(30) Foreign Application Priority Data
Jan. 2, 2019   (CN) .......................... 201910001327.3

(51) Int. Cl.
*H01L 27/00*   (2006.01)
*H01L 51/00*   (2006.01)
(Continued)

(52) U.S. Cl.
CPC ...... *H01L 51/5228* (2013.01); *H01L 27/3246* (2013.01); *H01L 27/3283* (2013.01); *H01L 51/56* (2013.01); *H01L 51/0022* (2013.01)

(58) Field of Classification Search
CPC ............. H01L 27/3246; H01L 27/3283; H01L 27/14638; H01L 27/14687;
(Continued)

(56) References Cited

U.S. PATENT DOCUMENTS 9,502,653 B2 * 11/2016 Chaji .................. H01L 27/3248
9,640,561 B2 *  5/2017 Park ..................... H01L 27/1259
(Continued)

FOREIGN PATENT DOCUMENTS

CN         102623644 A       8/2012
CN         106803547 A       6/2017
(Continued)

OTHER PUBLICATIONS

China First Office Action, Application No. 201910001327.3, dated May 8, 2020, 14 pps.: with English translation.

*Primary Examiner* — Nikolay K Yushin
(74) *Attorney, Agent, or Firm* — Armstrong Teasdale LLP

(57) ABSTRACT

The present disclosure provides an array substrate, a method for manufacturing the same, and a display device. The array substrate includes a substrate, a first dielectric layer disposed on the substrate, the first dielectric layer having recesses, a first conductive layer covering the first dielectric layer, and auxiliary conductive portions disposed at in the recesses and contacting the first conductive layer.

17 Claims, 6 Drawing Sheets

(51) Int. Cl.
*H01L 51/52* (2006.01)
*H01L 27/32* (2006.01)
*H01L 51/56* (2006.01)

(58) Field of Classification Search
CPC ........... H01L 27/14603; H01L 51/5228; H01L 51/56; H01L 51/0022
See application file for complete search history.

(56) References Cited

U.S. PATENT DOCUMENTS

| 10,642,079 B2* | 5/2020 | Chen ................. G02F 1/133514 |
| 2015/0179972 A1* | 6/2015 | Chaji ................. H01L 51/0021 |
| | | 257/40 |
| 2016/0079281 A1* | 3/2016 | Park .................. H01L 27/1218 |
| | | 257/72 |
| 2017/0005150 A1 | 1/2017 | Yeo et al. |
| 2019/0121183 A1* | 4/2019 | Chen ................. G02F 1/133514 |

FOREIGN PATENT DOCUMENTS

| CN | 107039486 A | 8/2017 |
| CN | 107093680 A | 8/2017 |
| CN | 107565048 A | 1/2018 |

\* cited by examiner

ARRAY SUBSTRATE, METHOD FOR MANUFACTURING THE SAME, AND DISPLAY DEVICE

CROSS REFERENCE TO RELATED APPLICATIONS

This patent application claims the benefit and priority of Chinese Patent Application No. 201910001327.3 filed on Jan. 2, 2019, the disclosure of which is incorporated by reference herein in its entirety as part of the present application.

BACKGROUND

Embodiments of the present disclosure relate to a field of display technologies, and in particular, to an array substrate, a method for manufacturing the same, and a display device.

Organic Light Emitting Diode (OLED) display devices are becoming the most promising display devices in recent years due to their advantages such as self-illumination, all-solid-state, and high contrast.

The top-emitting OLED display device can significantly improve the aperture ratio of the OLED display device and increase the Pixels Per Inch (PPI), thus it becomes a hot spot for the development of OLED high resolution display technology.

BRIEF DESCRIPTION

Embodiments of the present disclosure provide an array substrate, a method for manufacturing the same, and a display device.

One aspect of the present disclosure provides an array substrate. The array substrate includes a substrate, a first dielectric layer disposed on the substrate, the first dielectric layer having recesses, a first conductive layer covering the first dielectric layer, and auxiliary conductive portions disposed in the recesses and contacting the first conductive layer.

In an embodiment of the present disclosure, the first dielectric layer includes a pixel defining layer. The pixel defining layer has openings for defining pixels and inter-pixel portions disposed between the openings. The recesses are disposed in the inter-pixel portions of the pixel defining layer.

In an embodiment of the present disclosure, recesses are configured to have at least one of the following configurations: 1) the recesses include first recesses extending in a row direction, 2) the recesses include second recesses extending in a column direction, and 3) the recesses include the first recesses extending in the row direction and the second recesses extending in the column direction.

In an embodiment of the present disclosure, the array substrate further includes a second conductive layer disposed on the substrate, a projection of at least a portion of the second conductive layer on the substrate overlapping with a projection of the openings on the substrate, and a light emitting layer disposed between the first conductive layer and the second conductive layer.

In an embodiment of the present disclosure, the first conductive layer is transparent and the second conductive layer is reflective.

In an embodiment of the present disclosure, the auxiliary conductive portions are disposed over the first conductive layer.

In an embodiment of the present disclosure, the auxiliary conductive portions are disposed between the first dielectric layer and the first conductive layer.

Another aspect of the present disclosure provides a display device including the array substrate as described above.

Another aspect of the present disclosure provides a method for manufacturing an array substrate. The method includes providing a substrate, forming a first dielectric layer on the substrate, forming recesses in the first dielectric layer, and forming a first conductive layer and auxiliary conductive portions. The first conductive layer covers the first dielectric layer, and the auxiliary conductive portions are disposed in the recesses and contact the first conductive layer.

In an embodiment of the present disclosure, the auxiliary conductive portions are formed by inkjet printing.

In an embodiment of the present disclosure, the first dielectric layer includes a pixel defining layer. The pixel defining layer is formed to have openings for defining pixels and inter-pixel portions disposed between the openings. Forming the recesses includes removing a portion of the inter-pixel portions of the pixel defining layer to form the recesses.

In an embodiment of the present disclosure, forming the recesses includes at least one of the following options: 1) removing the portion of the inter-pixel portions in a row direction to form first recesses, 2) removing the portion of the inter-pixel portions in a column direction to form second recesses, and 3) removing the portion of the inter-pixel portions in the row direction to form the first recesses and removing the portion of the inter-pixel portions in the column direction to form the second recesses.

In an embodiment of the present disclosure, the method further includes forming a second conductive layer in the openings and on the substrate before forming the first conductive layer, and forming a light emitting layer on the second conductive layer and the inter-pixel portions.

In an embodiment of the present disclosure, forming the first conductive layer and the auxiliary conductive portions includes forming the first conductive layer on the first dielectric layer, and forming the auxiliary conductive portions on the first conductive layer in the recesses.

In an embodiment of the present disclosure, forming the first conductive layer and the auxiliary conductive portions includes forming the auxiliary conductive portions in the recesses, and forming the first conductive layer to cover the first dielectric layer and the auxiliary conductive portions.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

Additionally, further to be noted, when the elements and the embodiments thereof of the present disclosure are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

The flow diagrams depicted herein are just one example. There may be many variations to this diagram or the steps (or operations) described therein without departing from the spirit of the disclosure. For instance, the steps may be performed in a differing order or steps may be added, deleted, or modified. All of these variations are considered a part of the claimed disclosure.

Example embodiments will now be described more fully with reference to the accompanying drawings.

Figure 1:
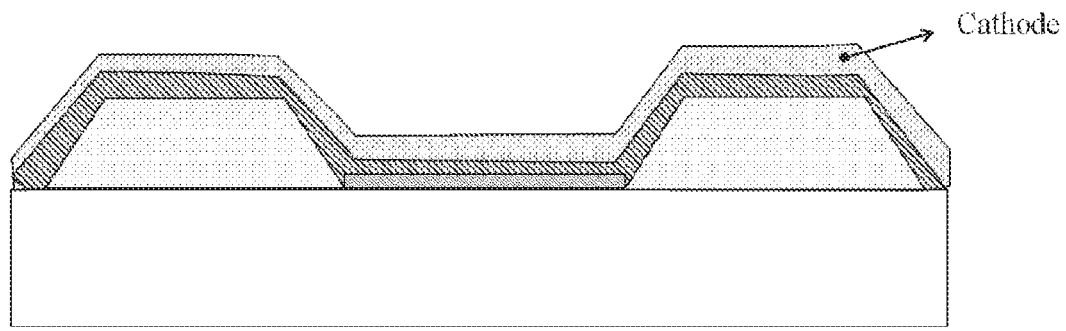
FIG. 1 shows a schematic cross-sectional view of an OLED display device.

At present, top-emitting OLED display devices have the advantages of higher aperture ratio and high efficiency. However, in view of optical properties, cathodes in top-emitting OLED display devices typically use a thin metal layer (as shown in FIG. 1), which can result in poor conductivity of the cathodes. Further, when applied to a device of a larger size (for example, a notebook computer of 13 inches or more), the thin cathode layer used in the top-emitting OLED display device significantly affects the IR drop of the display panel, thereby causing poor brightness uniformity of the display panel.

Embodiments of the present disclosure provide an array substrate capable of increasing the conductivity of a thin cathode layer and reducing IR drop caused by the thin cathode layer, thereby improving the brightness uniformity of the display panel.

In an embodiment of the present disclosure, the array substrate includes a substrate, a first dielectric layer disposed on the substrate, the first dielectric layer having recesses, and a first conductive layer covering (e.g., in a conformal manner) the first dielectric layer, and auxiliary conductive portions disposed in the recesses and contacting the first conductive layer.

Figure 2:
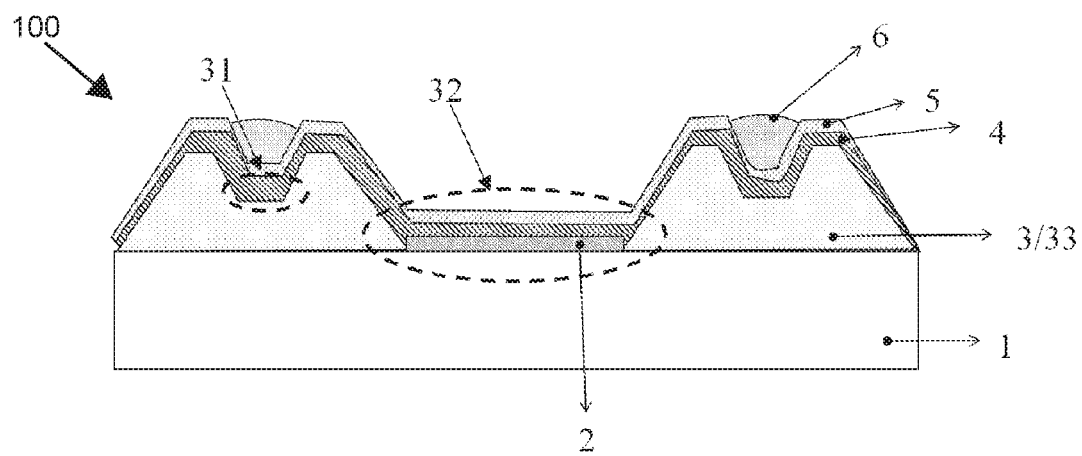
FIG. 2 shows a schematic cross-sectional view of an array substrate in accordance with an embodiment of the present disclosure.

On one hand, the first conductive layer may cover the first dielectric layer, and the auxiliary conductive portions may be disposed over the first conductive layer in the recesses, as shown in FIG. 2.

FIG. 2 shows a schematic cross-sectional view of an array substrate in accordance with an embodiment of the present disclosure. As shown in FIG. 2, an array substrate 100 includes a substrate 1, a first dielectric layer 3 disposed on the substrate 1, wherein the first dielectric layer 3 has recesses 31, a first conductive layer 5 covering the first dielectric layer 3, and auxiliary conductive portions 6 disposed on the first conductive layer 5 in the recesses 31.

Figure 3:
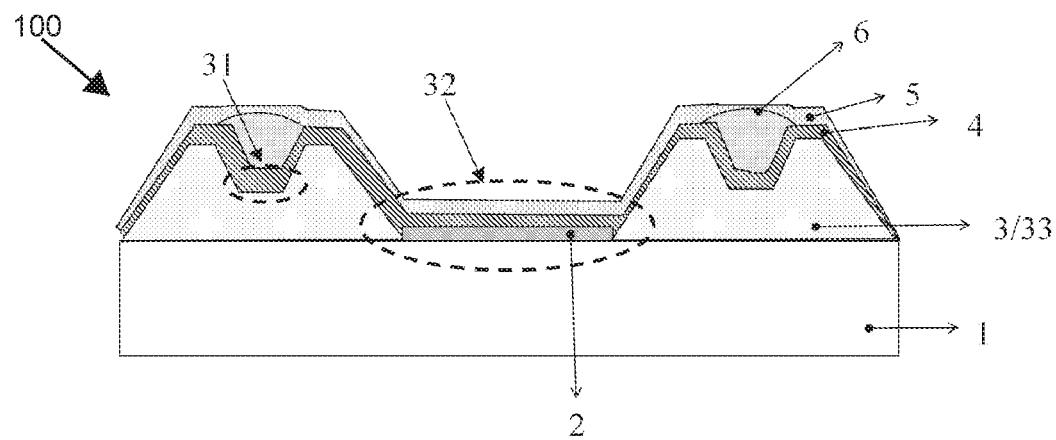
FIG. 3 shows a schematic cross-sectional view of an array substrate in accordance with an embodiment of the present disclosure.

On the other hand, the auxiliary conductive portions may be disposed in the recesses, and the first conductive layer may cover the first dielectric layer and the auxiliary conductive portions, as shown in FIG. 3.

FIG. 3 shows a schematic cross-sectional view of an array substrate in accordance with an embodiment of the present disclosure. FIG. 3 differs from FIG. 2 only in that the auxiliary conductive portions 6 is disposed in the recesses 31 and is disposed between the first dielectric layer 3 and the first conductive layer 5.

In an exemplary embodiment of the present disclosure, as shown in FIGS. 2 and 3, the auxiliary conductive portions 6 non-conformally fill the recesses 31.

In an exemplary embodiment of the present disclosure, a resistivity of the auxiliary conductive portions 6 is smaller than a resistivity of the first conductive layer 5. In an embodiment of the present disclosure, a combination of the auxiliary conductive portions and the first conductive layer can reduce IR drop.

In an exemplary embodiment of the present disclosure, as shown in FIGS. 2 and 3, the first dielectric layer 3 may include a pixel defining layer 3. The pixel defining layer 3 may have openings 32 for defining pixels and inter-pixel portions 33 disposed between the openings 32. As shown in FIGS. 2 and 3, the recesses 31 are disposed in the inter-pixel portions 33 of the pixel defining layer 3. It should be noted that the recesses 31 are disposed in the inter-pixel portions 33, which won't affect the light emitting area of the display device including the array substrate 100. Further, the auxiliary conductive portions 6 disposed in the recesses 31 won't affect the illumination of the pixels within the openings 32.

In an exemplary embodiment of the present disclosure, as shown in FIGS. 2 and 3, the array substrate 100 further includes a second conductive layer 2 disposed on the substrate 1, and a light emitting layer 4 disposed between the first conductive layer 5 and the second conductive layer 2. In an embodiment of the present disclosure, a projection of at least a portion of the second conductive layer 2 on the substrate 1 overlaps with a projection of the openings 32 on the substrate. As an example, the array substrate according to an embodiment of the present disclosure may include a top-emitting OLED display device. It will be appreciated that the combination of the auxiliary conductive portions 6 and the first conductive layer 5 can reduce a resistance of the cathode of the top-emitting OLED display device, thereby increasing the conductivity of the cathode and reducing the IR drop caused by the resistance, and thus improving the brightness uniformity of the display panel.

Further, the above light emitting layer 4 is disposed between the first conductive layer 5 and the second conductive layer 2 and covers the pixel defining layer 3. In an exemplary embodiment of the present disclosure, the first conductive layer 5 may be transparent, and the second conductive layer 2 may be reflective. As an example, the first conductive layer 5 may have a light transmittance of 40% to 50%, which should not be construed as a limit to the disclosure.

As an example, the array substrate according to an embodiment of the present disclosure may include a top-emitting OLED display device. For example, the second conductive layer 2 may be an anode of the top-emitting OLED display device. For example, the light emitting layer 4 may be a light emitting layer of the top-emitting OLED display device. For example, the first conductive layer 5 may be a cathode of the top-emitting OLED display device.

In an exemplary embodiment of the present disclosure, a material of the first conductive layer 5 may include a metal or a transparent conductive oxide. As an example, the material of the first conductive layer 5 may include magnesium or silver. As an example, the thickness of the first conductive layer 5 may be about 10-20 nm.

In an exemplary embodiment of the present disclosure, a material of the auxiliary conductive portions 6 may include a nano-metal material. As an example, the nano-metal material can be, for example, silver.

Figure 4:
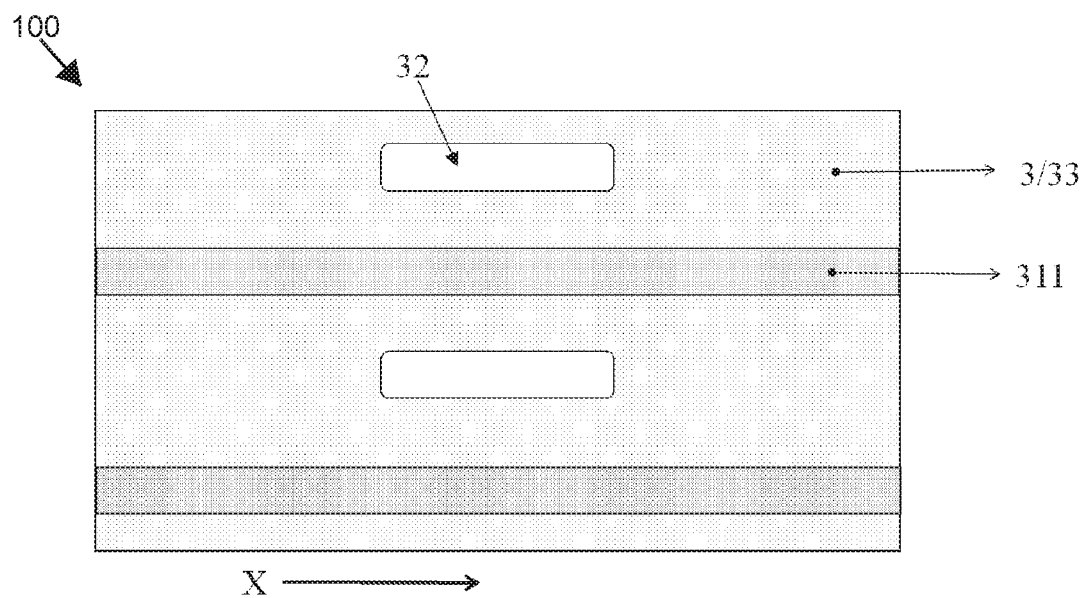
FIG. 4 shows a schematic planar-structural view of an array substrate in accordance with an embodiment of the present disclosure.

FIG. 4 shows a schematic planar-structural view of an array substrate in accordance with an embodiment of the present disclosure. Referring to FIGS. 2, 3, and 4, the recesses 31 in the inter-pixel portions 33 (or the pixel defining layer 3) of the array substrate 100 may include first recesses 311 extending in the row direction X.

Figure 5:
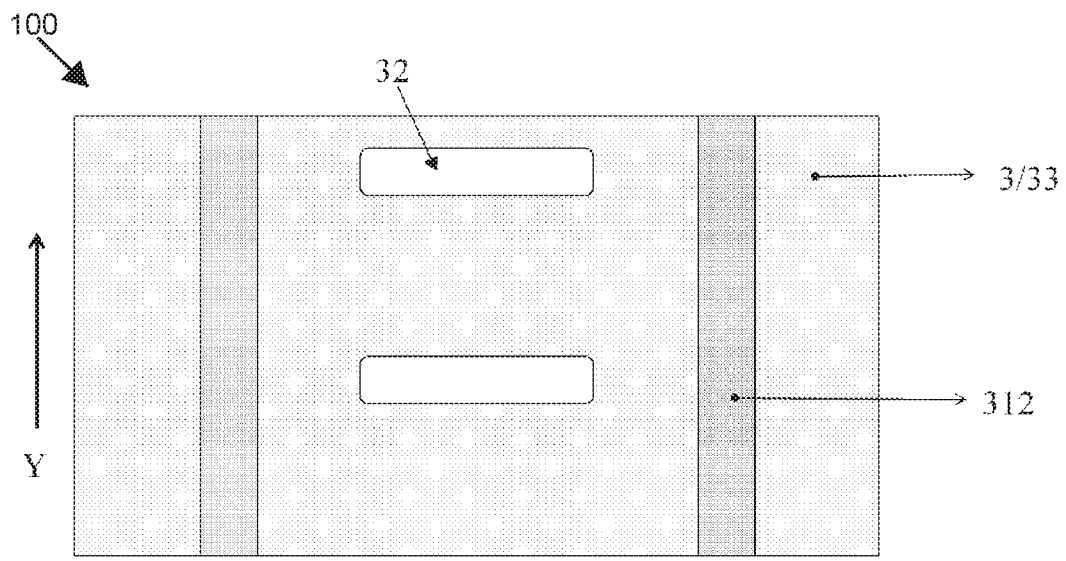
FIG. 5 shows another schematic planar-structural view of an array substrate in accordance with an embodiment of the present disclosure.

FIG. 5 shows another planar-structural view of an array substrate in accordance with an embodiment of the present disclosure. Referring to FIGS. 2, 3, and 5, the recesses 31 in the inter-pixel portions 33 (or the pixel defining layer 3) of the array substrate 100 may include second recesses 312 extending in a column direction Y.

Figure 6:
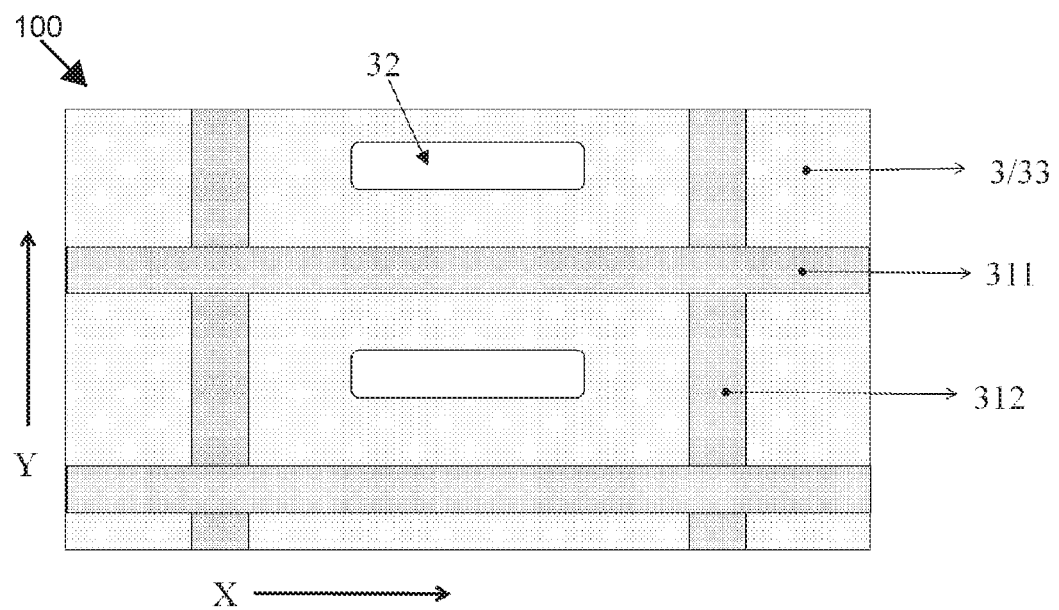
FIG. 6 shows still another schematic planar-structural view of an array substrate in accordance with an embodiment of the present disclosure.

FIG. 6 shows still another schematic planar-structural view of an array substrate in accordance with an embodiment of the present disclosure. Referring to FIGS. 2, 3, and 6, the recesses 31 in the inter-pixel portions 33 (or the pixel defining layer 3) of the array substrate 100 may include the first recesses 311 extending in the row direction X and the second recesses 312 extending in the column direction Y.

It can be appreciated that those skilled in the art can set the recesses in the row direction and/or the column direction according to actual needs.

Embodiments of the present disclosure also provide a display device including the array substrate as described above, which can increase the conductivity of a thin cathode layer and reduce the IR drop caused by the thin cathode layer, thereby improving the brightness uniformity of the display panel. For example, the display device can be an OLED display device.

Embodiments of the present disclosure also provide a method for manufacturing an array substrate.

Figure 7:
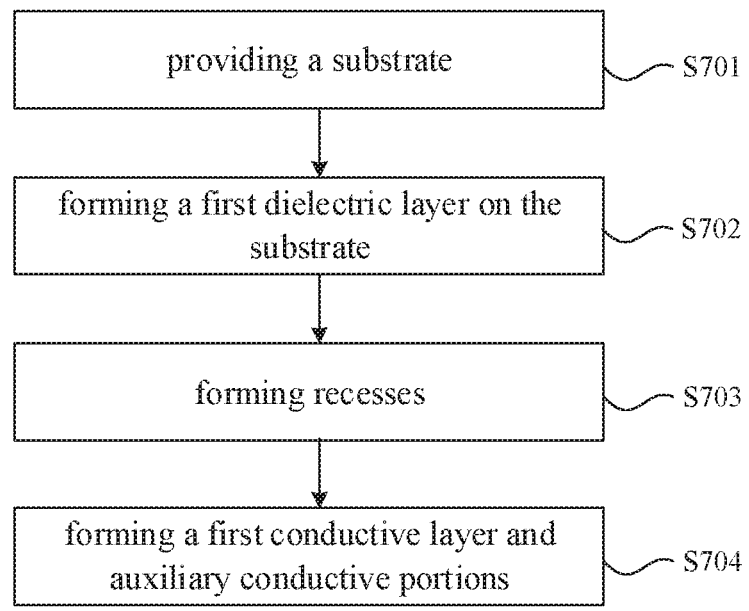
FIG. 7 shows a flow chart of a method for manufacturing an array substrate in accordance with an embodiment of the present disclosure.

FIG. 7 shows a flow chart of a method for manufacturing an array substrate in accordance with an embodiment of the present disclosure. As shown in FIG. 7, the method for manufacturing an array substrate includes steps S701-S704. The manufactured array substrate is shown in FIGS. 2 and 3.

Next, a method for forming the array substrate as shown in FIG. 2 will be described with reference to FIGS. 7 to 12.

Figure 8:
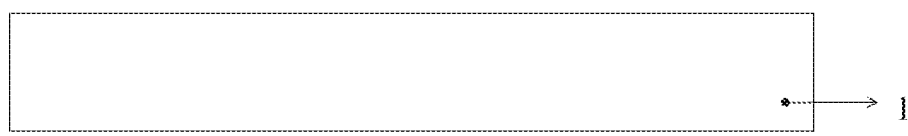
FIGS. 8-14 show schematic cross-sectional views of a method for manufacturing an array substrate in accordance with an embodiment of the present disclosure.

As shown in FIG. 8, in step S701, the substrate 1 is provided.

Figure 9:
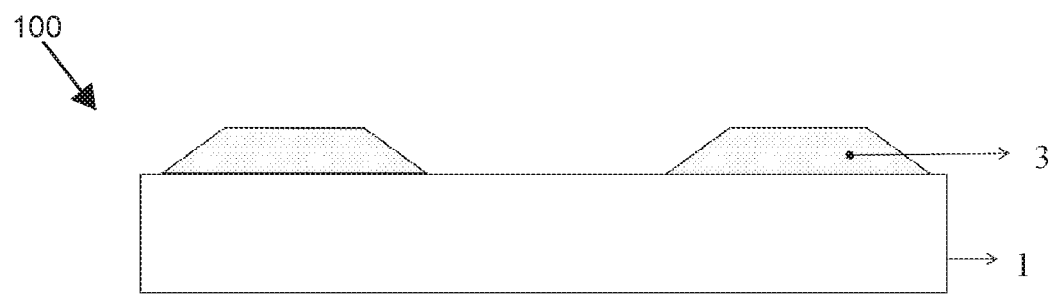

As shown in FIG. 9, in step S702, a first dielectric layer 3 is formed on the substrate 1.

Figure 10:
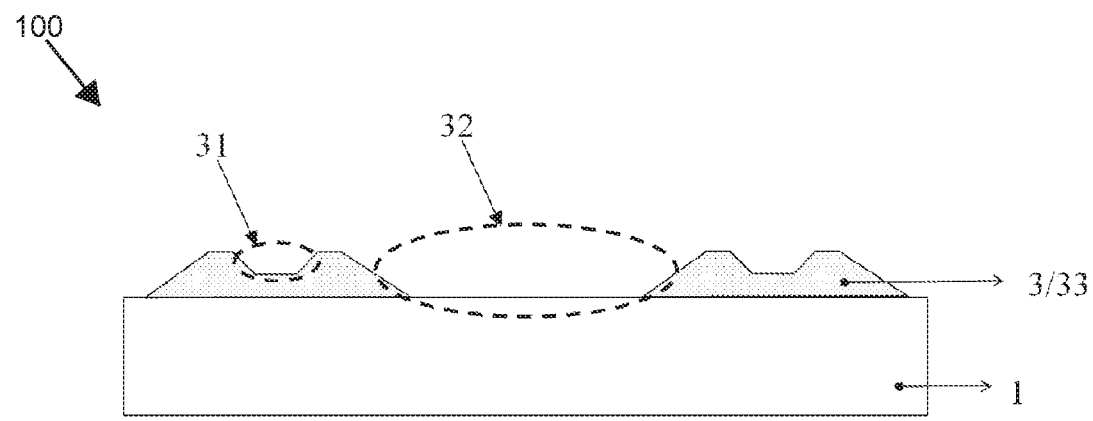

As shown in FIG. 10, in step S703, recesses 31 are formed in the first dielectric layer 3.

In an exemplary embodiment of the present disclosure, the first dielectric layer 3 includes a pixel defining layer 3. The pixel defining layer 3 is formed to have openings 32 for defining pixels and inter-pixel portions 33 disposed between the openings 32.

In an exemplary embodiment of the present disclosure, forming the recesses 31 includes removing a portion of the inter-pixel portions 33 of the pixel defining layer 3 to form the recesses 31. It should be noted that the recesses 31 are disposed in the inter-pixel portions 33 and won't affect the light emitting area of the display device including the array substrate 100.

Further, in an exemplary embodiment of the present disclosure, referring to FIG. 4, forming the recesses 31 includes removing the portion of the inter-pixel portions 33 in a row direction X to form first recesses 311.

As another example, referring to FIG. 5, forming the recesses 31 includes removing the portion of the inter-pixel portions 33 in a column direction Y to form second recesses 312.

As still another example, referring to FIG. 6, forming the recesses 31 includes removing the portion of the inter-pixel portions 33 in the row direction X to form the first recesses 311 and removing the portion of the inter-pixel portions 33 in the column direction Y to form the second recesses 312.

It can be understood that a person skilled in the art can form recesses along the row and/or column direction according to actual needs.

In step S704, a first conductive layer and auxiliary conductive portions are formed. The first conductive layer covers the first dielectric layer, and the auxiliary conductive portions are disposed in the recesses and contact the first conductive layer.

Optionally, on one hand, step S704 may include forming the first conductive layer to cover the first dielectric layer, and forming the auxiliary conductive portions on the first conductive layer in the recesses. In this embodiment, the cross-sectional structure of the formed array substrate is shown in FIG. 2.

Figure 11:
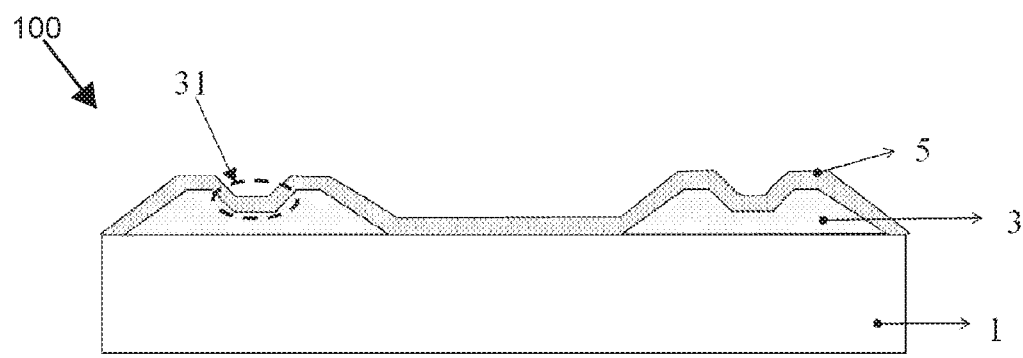

Specifically, as shown in FIG. 11, the first conductive layer 5 is formed to cover the first dielectric layer 3.

Figure 12:
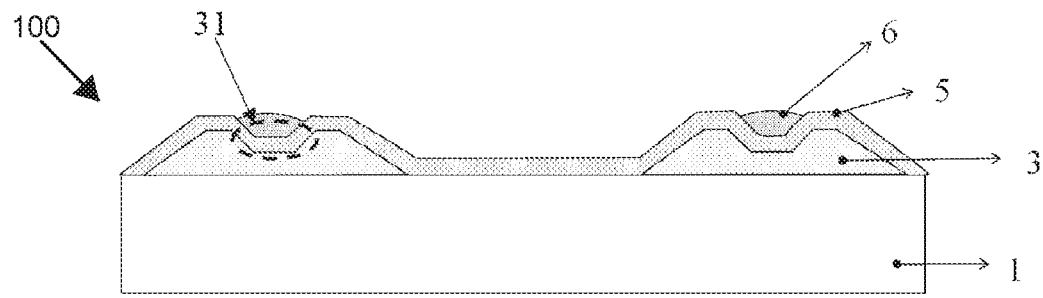

As shown in FIG. 12, the auxiliary conductive portions 6 are formed on the first conductive layer 5 in the recesses 31.

Optionally, on the other hand, step S704 may include forming auxiliary conductive portions on the first dielectric layer in the recesses, and forming the first conductive layer to cover the first dielectric layer and the auxiliary conductive portions. In this embodiment, the cross-sectional structure of the formed array substrate is as shown in FIG. 3.

Figure 13:
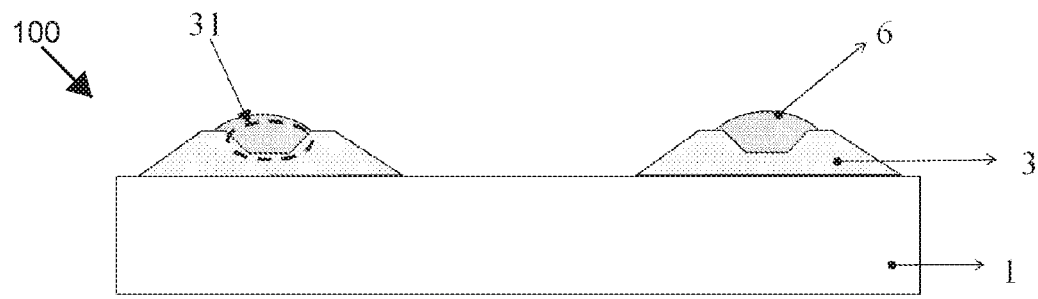

Specifically, as shown in FIG. 13, the auxiliary conductive portions 6 are formed on the first dielectric layer 3 in the recesses 31.

Figure 14:
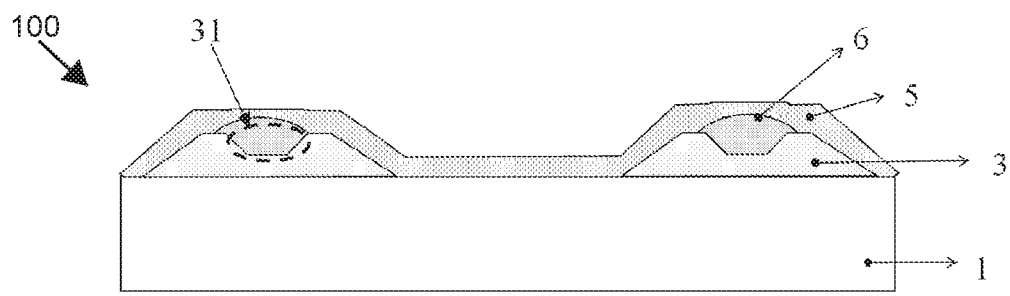

As shown in FIG. 14, the first conductive layer 5 is formed to cover the first dielectric layer 3 and the auxiliary conductive portions 6.

In an exemplary embodiment of the present disclosure, the auxiliary conductive portions 6 are formed by inkjet printing. It should be noted that since the presence of the recesses 31, forming the auxiliary conductive portions 6 by the inkjet printing method won't contaminate the pixels to be formed within the openings 32, thereby not affecting the light emitting effect of the finally formed display device.

In an exemplary embodiment of the present disclosure, the auxiliary conductive portions 6 are formed to non-conformally fill the recesses 31.

In an exemplary embodiment of the present disclosure, a resistivity of the auxiliary conductive portions 6 is smaller than a resistivity of the first conductive layer 5. In an embodiment of the present disclosure, a combination of the auxiliary conductive portions and the first conductive layer can reduce IR drop. Furthermore, the auxiliary conductive portions 6 disposed within the recesses 31 won't affect the illumination of the pixels within the openings 32.

In an exemplary embodiment of the present disclosure, referring to FIG. 2 and FIG. 3, prior to forming the first conductive layer 5, the method for manufacturing the array substrate 100 further includes forming a second conductive layer 2 in the openings 32 and on the substrate 1, and forming a light emitting layer 4 on the second conductive layer 2 and the inter-pixel portions 33.

In an exemplary embodiment of the present disclosure, the method for forming the first conductive layer, the second conductive layer, and the light emitting layer may include methods commonly used by those skilled in the art, for example, sputtering, chemical vapor deposition, plasma enhanced chemical vapor deposition, and the like. A person skilled in the art may select according to actual needs, which is not specifically limited herein.

In addition, other descriptions of the respective components of the embodiment are similar to the above-described embodiments, which will not be described herein again.

The foregoing description of the embodiment has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

What is claimed is:

1. An array substrate comprising:
a substrate;
a first dielectric layer disposed on the substrate, the first dielectric layer having recesses;
a first conductive layer covering the first dielectric layer; and
auxiliary conductive portions disposed in the recesses and contacting the first conductive layer, wherein the first dielectric layer comprises a pixel defining layer having openings for defining pixels and inter-pixel portions disposed between the openings, and wherein the recesses are disposed in the inter-pixel portions of the pixel defining layer.

2. The array substrate according to claim 1, wherein the auxiliary conductive portions are disposed between the first dielectric layer and the first conductive layer.

3. A display device comprising the array substrate according to claim 1.

4. The array substrate according to claim 1, wherein the recesses are configured to have at least one of the following configurations:
1) the recesses comprise first recesses extending in a row direction;
2) the recesses comprise second recesses extending in a column direction; and
3) the recesses comprise the first recesses extending in the row direction and the second recesses extending in the column direction.

5. A display device comprising the array substrate according to claim 4.

6. The array substrate according to claim 1, wherein the auxiliary conductive portions are disposed over the first conductive layer.

7. A display device comprising the array substrate according to claim 6.

8. The array substrate according to claim 1, further comprising:
a second conductive layer disposed on the substrate, a projection of at least a portion of the second conductive layer on the substrate overlapping with a projection of the openings on the substrate; and
a light emitting layer disposed between the first conductive layer and the second conductive layer.

9. A display device comprising the array substrate according to claim 8.

10. The array substrate according to claim 8, wherein the first conductive layer is transparent and wherein the second conductive layer is reflective.

11. A display device comprising the array substrate according to claim 10.

12. A method for manufacturing an array substrate, the method comprising:
providing a substrate;
forming a first dielectric layer on the substrate;
forming recesses in the first dielectric layer; and
forming a first conductive layer and auxiliary conductive portions, wherein the first conductive layer covers the first dielectric layer and the auxiliary conductive portions are disposed in the recesses and contact the first conductive layer, wherein the first dielectric layer comprises a pixel defining layer, the pixel defining layer formed to have openings for defining pixels and inter-pixel portions disposed between the openings, and wherein forming the recesses comprises removing a portion of the inter-pixel portions of the pixel defining layer to form the recesses.

13. The method according to claim 12, wherein the auxiliary conductive portions are formed by inkjet printing.

14. The method according to claim 12, wherein forming the recesses comprises at least one of the following:
1) removing the portion of the inter-pixel portions in a row direction to form first recesses;
2) removing the portion of the inter-pixel portions in a column direction to form second recesses; and
3) removing the portion of the inter-pixel portions in the row direction to form the first recesses and removing the portion of the inter-pixel portions in the column direction to form the second recesses.

15. The method according to claim 12, further comprising:
forming a second conductive layer within the openings and on the substrate prior to forming the first conductive layer; and forming a light emitting layer on the second conductive layer and the inter pixel portions.

16. The method according to claim 12, wherein forming the first conductive layer and the auxiliary conductive portions comprises forming the first conductive layer on the first dielectric layer, and forming the auxiliary conductive portions on the first conductive layer in the recesses.

17. The method according to claim 12, wherein forming the first conductive layer and the auxiliary conductive portions comprises forming the auxiliary conductive portions in the recesses, and forming the first conductive layer to cover the first dielectric layer and the auxiliary conductive portions.

* * * * *